(12) United States Patent
Champion et al.

(10) Patent No.: US 6,819,103 B2
(45) Date of Patent: Nov. 16, 2004

(54) LORENTZ FORCE DRIVEN MECHANICAL FILTER/MIXER DESIGNS FOR RF APPLICATIONS

(75) Inventors: John L. Champion, Highland, MD (US); Robert Osiander, Ellicott City, MD (US); Robert B. Givens, Frederick, MD (US); Dennis K. Wickenden, Woodbine, MD (US); Daniel G. Jablonski, Bethesda, MD (US); James H. Higbie, Catonsville, MD (US); Scott T. Radcliffe, Ellicott City, MD (US); Margaret A. Darrin, Bowie, MD (US); Thomas J. Kistenmacher, Columbia, MD (US); Douglas A. Oursler, Columbia, MD (US)

(73) Assignee: The Johns Hopkins University, Baltimore, MD (US)

( * ) Notice: Subject to any disclaimer, the term of this patent is extended or adjusted under 35 U.S.C. 154(b) by 203 days.

(21) Appl. No.: 10/276,983

(22) PCT Filed: Apr. 24, 2002

(86) PCT No.: PCT/US02/13058

§ 371 (c)(1),
(2), (4) Date: Nov. 21, 2002

(87) PCT Pub. No.: WO02/088764

PCT Pub. Date: Nov. 7, 2002

(65) Prior Publication Data

US 2004/0150398 A1 Aug. 5, 2004

Related U.S. Application Data

(60) Provisional application No. 60/286,431, filed on Apr. 26, 2001.

(51) Int. Cl.[7] .............................................. G01R 33/00
(52) U.S. Cl. ........................ 324/260; 324/244; 73/778
(58) Field of Search ................................ 324/260, 244, 324/209, 244.1, 258, 658; 331/65, 96, 154, 155, 156, 157; 356/498; 73/778–780

(56) References Cited

U.S. PATENT DOCUMENTS

5,959,452 A * 9/1999 Givens et al. ............... 324/260
5,963,857 A * 10/1999 Greywall ..................... 455/307

OTHER PUBLICATIONS

PCT International Search Report, PCT/US02/13058, Mailed Sep. 16, 2002.
Polysilicon Xylophone Bar Magnetometers, Solid–State Sensor & Actuator Workshop, Hilton Head, SC, Jun. 4–8, 2000 by Wickenden et al.
Micromechanical RF Filters Excited by the Lorentz Force, J. Micromech. Microeng. 9 (1999) 78–84, by Greywall.

(List continued on next page.)

Primary Examiner—Jay Patidar
(74) Attorney, Agent, or Firm—Albert J. Fasulo, II

(57) ABSTRACT

A Lorentz force-driven mechanical resonator apparatus that utilizes a high-Q resonant structure as both a mixing device and a high-Q bandpass filter. Specifically, an external time varying, but quasistatic, magnetic field is applied to the resonating device while simultaneously running a time varying electrical current through the device. The resulting Lorentz force (I×B) is proportional to the vector product of the electrical current in the bar (I) and the external magnetic field (B). Integrating such a resonant device with a magnetic field coil produces the functionality of an ideal radio frequency (RF) mixer coupled with a high-Q intermediate frequency (IF) filter. Wide tunability provides the capability to scan, or even step, an array of filters having very narrow bandwidths via a common local oscillator to a desired frequency range.

9 Claims, 3 Drawing Sheets

OTHER PUBLICATIONS

Heterodyne Detection of Alternating Magnetic Fields with a Resonating Xylophone Bar Magnometer Applied Physics Letters, vol. 74, #10, Mar. 8, 1999 by Givens et al.

Micromechanical Mixer+Filters, 1998IEEE, IEDM 98–471, by Wong et al.

Micro Electromechanical Filters for Signal Processing, Journal of Microelectro Mechanical Systems, vol. 7, #3, 9/99, by Lin et al.

A High Sensitivity, Wide Dynamic Range Magnometer Designed on a Xylophone Resonator, 1996 American Institute of Physics, by Givens et al. (Appl. Phys. 'Lett'. 69(18) Oct. 28, 1996).

High Frequency Microelectromechanical IF Filters, IEDM 96–773, by Bannon et al.

* cited by examiner

LORENTZ FORCE DRIVEN MECHANICAL FILTER/MIXER DESIGNS FOR RF APPLICATIONS

CROSS REFERENCE TO RELATED APPLICATIONS

This application is a 371 of PCT/US02/13058 filed Apr. 24, 2002 which claims the benefit of U.S. provisional application Ser. No. 60/286,431, filed Apr. 26, 2001 entitled "Mechanical Filter/Mixer for Radio Frequency Applications" which is hereby incorporated by reference in its entirety.

FIELD OF THE INVENTION

The present invention is related to a Lorentz force-driven resonator, such as a xylophone bar magnetometer (XBM), based mechanical mixer/filter for radio frequency (RF) applications. More specifically, the present invention is related to an array of Lorentz force-driven mechanical filter/mixers for use in channelized RF receiver applications.

BACKGROUND

The Johns Hopkins University Applied Physics Laboratory has patented a novel device capable of high frequency magnetic field measurement, the xylophone bar magnetometer of U.S. Pat. No. 5,959,452, which makes use of the Lorentz force generated by a current in a magnetic field. Two principle advantages of the Lorentz force-driven resonant device over other mechanical designs are its ability to function as both a filter and mixer/downconverter and its implementation as a micro electromechanical system (MEMS) design.

There is increasing interest in the development of miniature, high frequency narrow band filters to replace existing filters in RF applications. The trend is constantly toward smaller size, lower power consumption, and lower cost for similar performance. Existing high frequency, narrow band filters are based on large, superconducting systems or utilize multiple electronic filter stages. The Lorentz force-driven mechanical resonator described herein can be used as a filter and a mixer to process signals over a broad range of frequencies.

SUMMARY

The present invention is a mechanical mixer/filter apparatus that is rooted in a resonator design described in commonly owned U.S. Pat. No. 5,959,452 which is incorporated herein by reference. The present invention also includes a system in which an integrated array of microfabricated, electromechanical mixer/filters may be used, inter alia, in channelized RF receiver applications.

The present invention is based on the Lorentz force-driven resonating bar magnetometer that utilizes a high Q resonant structure as both a mixing device and a high-Q bandpass filter. Specifically, an external time varying magnetic field (B) may be applied to the device while simultaneously running a time varying electrical current (I) through the device. The resulting Lorentz force (I×B) is proportional to the vector product of the electrical current in the bar and the external magnetic field. By adjusting the frequencies of the current and external magnetic field, the Lorentz force can be controlled to cause the bar to vibrate at its resonant frequency.

Integrating a Lorentz force-driven mechanical resonator with a magnetic field coil produces the functionality of an ideal RF mixer coupled with a high-Q intermediate frequency (IF) filter. Furthermore, a Lorentz force-driven mechanical resonator mixer/filter can operate in mixing mode at frequencies into the GHz range making it useful for UHF and VHF applications. This includes, but is not limited to, cellular and wireless applications, particularly those in which space, weight and power are considerations. Each of the Lorentz force-driven mechanical resonator designs presented herein may also be arrayed for use in channelized RF applications.

DETAILED DESCRIPTION

Figure 1:
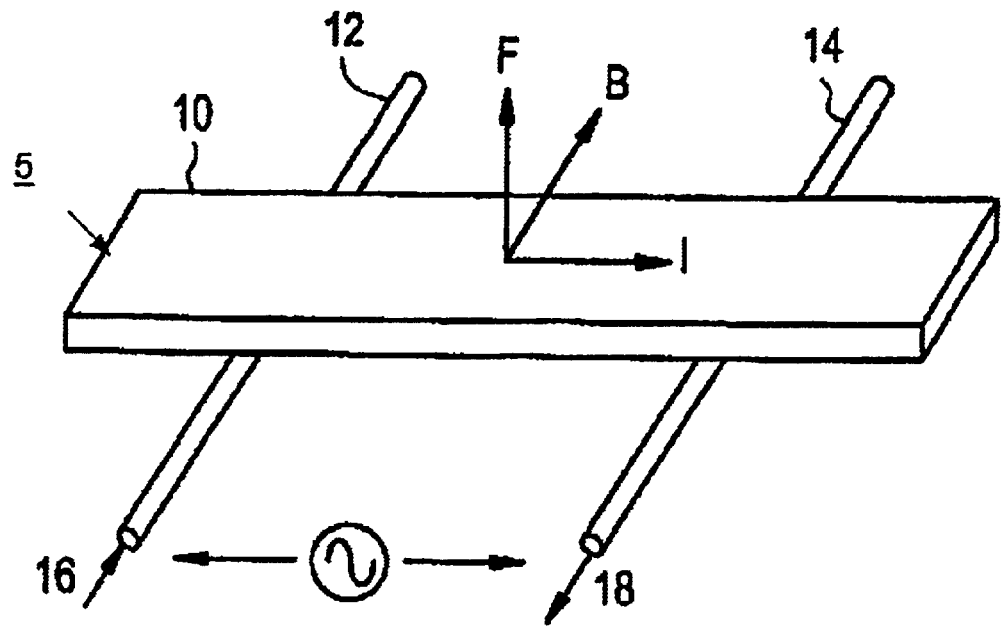
FIG. 1 illustrates a prior art design of a Lorentz force-driven mechanical resonator known as a xylophone bar magnetometer (XBM).

A Lorentz force-driven mechanical resonator measures the deflection in a conducting bar produced by the Lorentz force as represented by the equation (F=I×B) where F is the Lorentz force, I is a current, and B is a magnetic field. FIG. 1 (prior art) illustrates an embodiment of a Lorentz force-driven mechanical resonator in the form of a xylophone bar magnetometer (XBM) 5 described in commonly owned U.S. Pat. No. 5,959,452. It is comprised of a resonator 10, in this case a thin conductive, e.g., aluminum, bar, supported by two wires 12, 14. The wires are bonded to the bar to provide low-resistance electrical contacts and positioned at the nodal points expected for a bar free at both ends and vibrating in its fundamental mode.

In operation, alternating currents, generated by a sinusoidal source oscillating at the fundamental transverse resonant mode, are supplied to the bar at one of two support nodes 16 and extracted at the other node 18, and the device is placed inside a magnetic field. The Lorentz force generated by the current and the applied magnetic field causes the bar to vibrate in its fundamental mode, the amplitude being proportional to the vector component of the magnetic field parallel to the support wires in the plane of the bar.

The amplitude of the vibration can be measured using various techniques, including optical beam deflection, optical interferometry, differential capacitance and tunneling currents. The Lorentz force-driven mechanical resonator structure can serve as a fundamental component for numerous RF applications.

Figure 2:
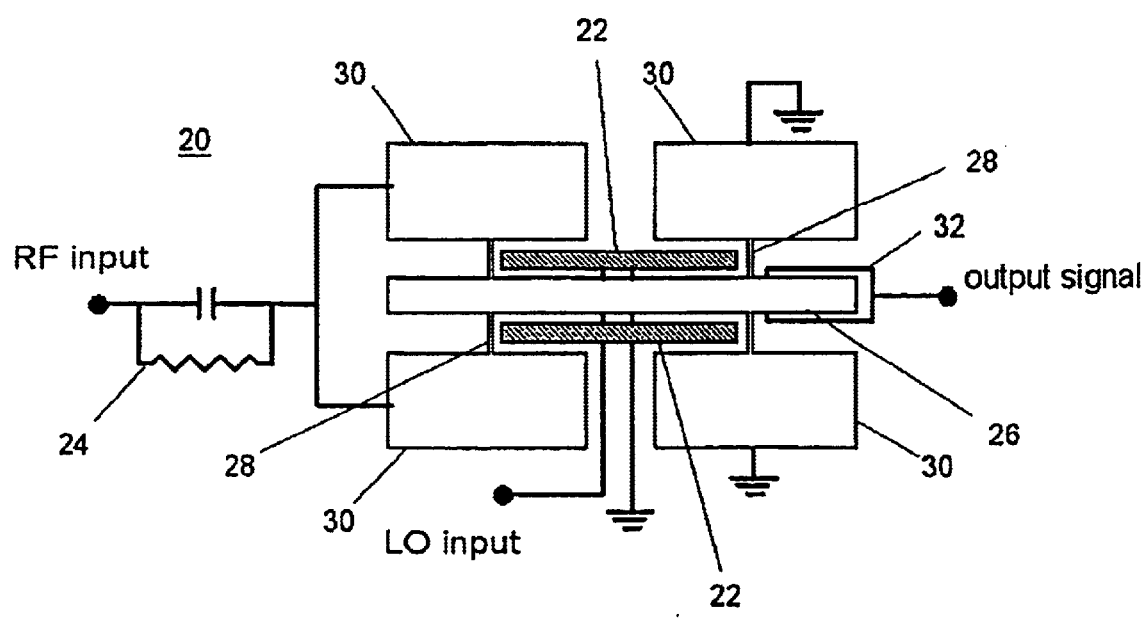
FIG. 2 illustrates an Lorentz force-driven mechanical resonator based component design that provides the basis for an RF-mixer/filter.

FIG. 2 illustrates a Lorentz force-driven mechanical resonator based mixer/filter component 20 that provides a basis for an RF-mixer/filter array design. A local oscillator (LO) input signal at frequency $f_{LO}$ drives a pair of magnetic field coils 22 to create a magnetic field (B). In this design, the magnetic field coils 22 are placed lengthwise on either side of Lorentz force-driven mechanical resonator 26. An RF input signal at frequency $f_{RF}$ passes through an impedance matching network 24 and drives an electrical current (I) in the mechanical resonator 26. If the RF frequency is equal to ($f_{Lo}+f_0$) or to ($f_{LO-f0}$), where $f_0$ is the resonance frequency of the mechanical resonator 26, then the mechanical resonator 26 begins to resonate. The mechanical resonator 26 is supported by a pair of support arms 28. The ends of one support arm 28 are coupled with anchor/electrodes 30 that receive the impedance matched RF input signal while the ends of the other support arm 28 are coupled with anchor/electrodes 30 that are grounded. A readout electrode 32 is coupled with the mechanical resonator 26 to provide a Lorentz force output signal (F) for the mixer/filter component 20. In this design, the amplitude of the vibration of the mechanical resonator 26 is determined via direct measurement of capacitance between the bar and an electrode 32 placed near the bar. Other methods or means for determining the amplitude of the vibration of the mechanical resonator 26 may be substituted as described above.

In its implementation as a mixer/filter, a Lorentz force-driven mechanical resonator is a component that can be fashioned into a combined mixer/IF filter for traditional superheterodyne receiver applications, as illustrated in FIG. 2. Because of its high mechanical Q factor, the Lorentz force-driven mechanical resonator can eliminate the multiple conversion stages required in traditional superheterodyne receivers that operate in the UHF to VHF range. To achieve a narrow-IF bandwidth though traditional means, the IF frequency must be relatively low compared to the bandwidth of the signal of interest due to the limitations on the Q factors of electronic devices. For many practical applications, this necessitates the use of multiple IF stages within a receiver system. However, the Lorentz force-driven mechanical resonator allows for high IF frequencies with very high Q values reducing the requirements of the image reject filter while also supplying high compression of interfering signals.

For mixing/filtering implementations where the RF signal frequency content is greater than the resonant frequency of the Lorentz force-driven mechanical resonator, the Lorentz force-driven mechanical resonator resonates only when the difference between the current and magnetic field frequencies are within the bandwidth of the mechanical resonance (i.e., $|f_{LO}-f_{RF}|=f_0$). Thus, the Lorentz force-driven mechanical resonator behaves as a narrowband mixer, with an IF given by its mechanical resonant frequency.

One advantageous aspect of a Lorentz force-driven mechanical resonator based mixer/filter design is the ability to build a heterodyne receiver having a single IF stage. As stated above, the limited Q of electronic filters means that multiple IF stages are generally required to achieve a desired band selection. Utilizing an XBM based mixer/filter design, however, allows down conversion with a narrow bandwidth in a single step and requires only one local oscillator (LO). For a channelized receiver, arrays of different XBM components can be used, each with a very distinct bandwidth (i.e., different resonant frequencies $f_0$). A single local oscillator can be used to tune the array of Lorentz force-driven mechanical resonators to the band of interest, and to compensate the array for environmentally induced frequency drifts. Such a mixer/filter design principally differs from other approaches in the wide tunability of the entire array. Wide tunability provides the capability to scan, or even step, an array of Lorentz force-driven mechanical resonator filters having very narrow bandwidths to a desired frequency range via a common local oscillator.

The outstanding performance of a superheterodyne receiver is based on the benefits of tuning the local oscillator rather than the filter. However, an array of high Q Lorentz force-driven mechanical resonator filter/mixer components maintains this benefit and mimics the behavior of a tunable system by utilizing a fixed frequency oscillator with an array of Lorentz force-driven mechanical resonator IF filters tuned to different frequencies. Thus, an array of Lorentz force-driven mechanical resonator devices (including MEMS designs) achieves the performance of a tunable receiver without having to tune the local oscillator.

A characteristic of mechanical resonators is their sensitivity to temperature variations. When used as an oscillator or filter, this can lead to the need for temperature-controlled environments of the sort used for high accuracy crystal oscillators. However, because of the reduced size and thermal mass of Lorentz force-driven mechanical resonator MEMS devices, temperature-controlled environments can be reduced in size, power level, and complexity. On an array of these devices, the thermal drift of a reference resonator can be used to tune a local oscillator (LO) and maintain the resonant condition for a given RF signal. Moreover, if a resonator is used not only as a mixer and IF filter, but also as an oscillator, an integrated device in which the oscillator frequency and the IF center frequency drift together can be designed such that their combined performance is temperature-invariant. If the IF filter is followed by a traditional frequency-independent second detector as typically used in a superheterodyne system, it is of little consequence if the IF frequency drifts, so long as the oscillator drifts by a corresponding amount.

There are a variety of additional RF applications for the system of the present invention ranging from radios to radars to spectrum analyzers. When implemented as an array of Lorentz force-driven mechanical resonators, multiple devices can be used in many applications. For instance, a channelized radio receiver can be developed that receives and processes multiple narrowband signals simultaneously. Or, multiple devices can be combined as a demultiplexing system for stripping individual telephone calls from, for instance, a T1 carrier. Another application can be a multi-channel spectrum analyzer in which the simultaneous use of parallel channels provided by a resonator array eliminates the constraint between the resolution bandwidth and sweep speed that currently exists for traditional spectrum analyzers. This constraint represents a serious signal-processing bottleneck in conventional systems.

Figure 3:
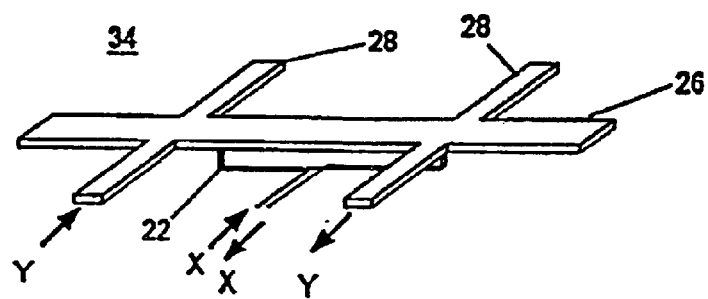
FIG. 3 illustrates an alternative Lorentz force-driven mechanical resonator mixer/filter component design using a coil positioned beneath the resonator.

FIG. 3 illustrates an alternative Lorentz force-driven mechanical resonator mixer/filter design 34 using a magnetic field coil positioned lengthwise beneath the Lorentz force-driven mechanical resonator 26 between the support arms 28. In this mixer/filter design, a local oscillator (LO) input signal (X) drives a magnetic field coil 22 to create a magnetic field (B). An RF input signal (Y) drives an electrical current (I) in the Lorentz force-driven mechanical resonator 26 via a pair of support arms 28. As described earlier, the amplitude of the vibration of the resonator 26 can be measured using a variety of techniques, including optical beam deflection, optical interferometry, differential capacitance and tunneling currents.

Figure 4:
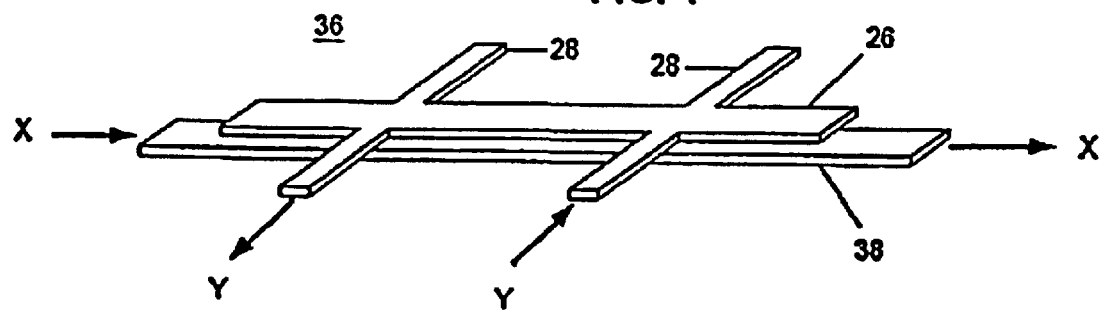
FIG. 4 illustrates still another alternative Lorentz force-driven mechanical resonator mixer/filter component design using a single strip adjacent to the resonator.

FIG. 4 illustrates still another alternative Lorentz force-driven mechanical resonator mixer/filter design 36 using a single strip 38 positioned lengthwise beneath the Lorentz force-driven mechanical resonator 26. In this mixer/filter design, a local oscillator (LO) input signal (X) drives the strip 38 to create a magnetic field (B). An RF input signal (Y) drives an electrical current (I) in the Lorentz force-driven mechanical resonator 26 via a pair of support arms 28. Again, the amplitude of the vibration of the Lorentz force-driven mechanical resonator 26 can be measured using a variety of techniques, as previously described.

Figure 5:
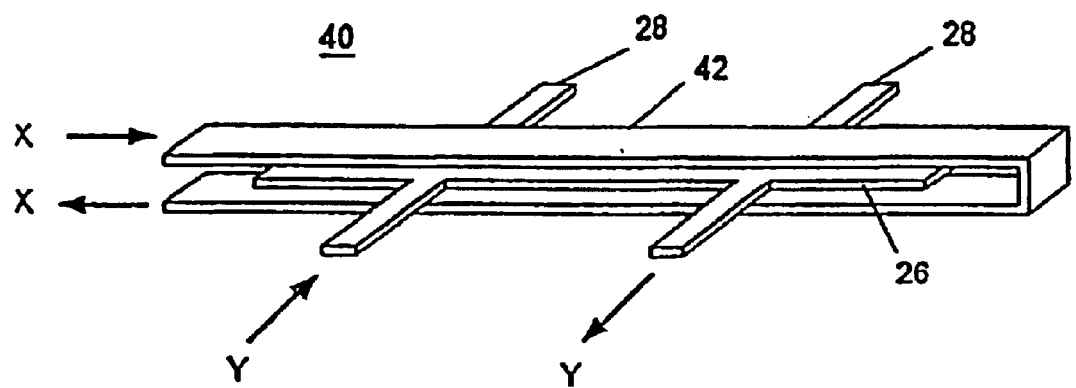
FIG. 5 illustrates yet another alternative Lorentz force-driven mechanical resonator mixer/filter component design using a strip loop around the resonator.

FIG. 5 illustrates yet another alternative Lorentz force-driven mechanical resonator mixer/filter design 40 using a strip loop 42 positioned lengthwise about the Lorentz force-driven mechanical resonator 26. In this mixer/filter design, a local oscillator (LO) input signal (X) drives the strip loop 42 to create a magnetic field (B). An RF input signal (Y) drives an electrical current (I) in the Lorentz force-driven mechanical resonator 26 via a pair of support anus 28. Again, the amplitude of the vibration of the Lorentz force-driven mechanical resonator 26 can be measured using a variety of techniques as previously described.

Figure 6:
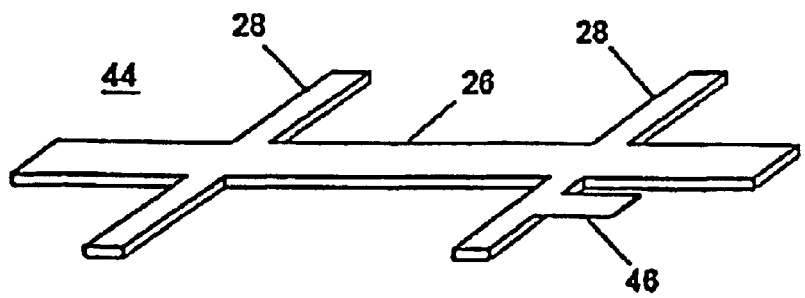
FIG. 6 illustrates an alternative Lorentz force-driven mechanical resonator design that includes a secondary resonator.

FIG. 6 illustrates an alternative Lorentz force-driven mechanical resonator design 44 that includes a secondary resonator. It is comprised of a first mechanical resonator 26, supported by two support arms 28. The support arms 28 are bonded to the mechanical resonator 26 to provide low-resistance electrical contacts, and positioned at the nodal points expected for a bar free at both ends and vibrating in its fundamental mode. A secondary mechanical resonator 46 is bonded to one of the support arms 28. The secondary resonator 46 is driven mechanically by the motion of the primary resonator 26. Relative to the primary resonator 26, the more compliant secondary resonator 46 exhibits increased vibrational amplitude, hence increased sensitivity.

In operation, alternating currents, generated by a sinusoidal source oscillating at the fundamental transverse resonant mode, are supplied to the first resonator 26 at one of the support arms 28 and extracted at the other support arm 28, and the device is placed inside a set of Helmholtz coils. The Lorentz force generated by the current and the applied magnetic field causes the bar to vibrate in its fundamental mode, the amplitude being proportional to the vector component of the field in the plane of the bar and parallel to the support wires.

The Lorentz force-driven mechanical resonator designs of FIGS. 2–5 are interchangeable with respect to one another. It is also noted that for each of the mixer/filter designs, the RF input signal can be applied across the coil/strip and the local oscillator (LO) signal applied across the Lorentz force-driven mechanical resonator 26 or, the RF input signal can be applied across the Lorentz force-driven mechanical resonator 26 and the local oscillator (LO) signal applied across the coil/strip. That is, the X and the Y in FIGS. 3–5 are interchangeable. In addition, each of the Lorentz force-driven mechanical resonator mixer/filter designs described herein are capable of being arrayed together to produce the same functional results as described with respect to FIG. 2. Moreover, the Lorentz force-driven mechanical resonator design of FIG. 6 which includes a secondary resonator may also be substituted into the Lorentz force-driven mechanical resonator mixer/filter designs.

In the following claims, any means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A Lorentz force-driven mechanical mixer/filter comprising:
    a resonator having a resonant frequency, $f_0$, and being supported at relevant nodal points, wherein an RF signal of frequency $f_{RF}$ is input across relevant nodal points causing a current to flow along the resonator, the resonator being placed in a detectable magnetic field driven by a local oscillator set to a frequency, $f_{LO}$, the magnetic field being normal to the direction of the current in the resonator, said magnetic field producing a Lorentz force normal to the resonator, the Lorentz force causing a detectable deflection in the resonator when $|f_{LO} \pm f_{RF}| = f_0$.

2. The mechanical mixer/filter of claim 1 further comprising a means for detecting the deflection of the resonator.

3. The mechanical mixer/filter of claim 2 wherein the means for detecting the deflection of the resonator is comprised of an optical beam deflection technique.

4. The mechanical mixer/filter of claim 2 wherein the means for detecting the deflection of the resonator is comprised of an optical interferometric displacement measurement.

5. The mechanical mixer/filter of claim 2 wherein the means for detecting the deflection of the resonator is comprised of a capacitance measurement between the resonator and an electrode placed near the resonator.

6. The mechanical mixer/filter of claim 1 wherein the magnetic field is created by coupling the local oscillator to a pair of coils positioned lengthwise on either side of the resonator.

7. The mechanical mixer/filter of claim 1 wherein the magnetic field is created by coupling the local oscillator to a coil positioned lengthwise beneath the resonator.

8. The mechanical mixer/filter of claim 1 wherein the magnetic field is created by coupling the local oscillator to a strip positioned lengthwise beneath the resonator.

9. The mechanical mixer/filter of claim 1 wherein the magnetic field is created by coupling the local oscillator to a strip loop positioned lengthwise about the resonator.

\* \* \* \* \*